United States Patent [19]
Yokoya et al.

[11] Patent Number: 5,566,365
[45] Date of Patent: Oct. 15, 1996

[54] ACTIVE FILTER CIRCUIT AND PORTABLE TELEPHONE APPARATUS

[75] Inventors: Satoshi Yokoya, Kanagawa; Taiwa Okanobu; Yukinobu Kawamura, both of Tokyo, all of Japan

[73] Assignee: Sony Corporation, Tokyo, Japan

[21] Appl. No.: 392,492

[22] Filed: Feb. 23, 1995

[30] Foreign Application Priority Data

Mar. 1, 1994 [JP] Japan .................................. 6-055301

[51] Int. Cl.$^6$ ...................................................... H04B 1/10
[52] U.S. Cl. ........................... 455/307; 455/311; 455/313; 455/339
[58] Field of Search ...................................... 455/307, 308, 455/311, 313, 314, 315, 338, 332, 339; 327/552, 557, 558

[56] References Cited

U.S. PATENT DOCUMENTS

| | | |
|---|---|---|
| 4,804,904 | 2/1989 | Katakura . |
| 5,030,848 | 7/1991 | Wyattt ..................................... 327/552 |
| 5,053,650 | 10/1991 | Ohkubo et al. ........................ 327/558 |
| 5,081,423 | 1/1992 | Koyama et al. ........................ 327/557 |
| 5,266,852 | 11/1993 | Shigenari et al. ...................... 327/552 |
| 5,475,331 | 12/1995 | Bult et al. ............................... 327/427 |

FOREIGN PATENT DOCUMENTS

231510A 7/1988 Japan .

Primary Examiner—Reinhard J. Eisenzopf
Assistant Examiner—Gertrude Arthur
Attorney, Agent, or Firm—Jay H. Maioli

[57] ABSTRACT

An active filter circuit used in a receiver circuit of a cellular telephone or the like has a voltage/current conversion circuit, an integrating circuit and a current dividing circuit. The voltage/current conversion circuit converts an input signal voltage to a signal current. The signal current output by the voltage/current conversion circuit is divided between the integrating circuit and ground. The current dividing circuit divides the signal current output by the voltage/current conversion circuit between the integrating circuit and ground. The current dividing circuit extracts low frequency components of the input signal voltage from the integrating circuit, and adjusts the cutoff frequency with respect to the extracted low frequency components to change the dividing ratio of the signal current output from the conversion circuit between the integrating circuit and ground.

12 Claims, 6 Drawing Sheets

ACTIVE FILTER CIRCUIT AND PORTABLE TELEPHONE APPARATUS

BACKGROUND

1. Field of the Invention

The present invention relates to an active filter and a portable telephone apparatus. More particularly, the present invention relates to an active filter suitable for an IC and a portable telephone apparatus using this filter.

2. Background of the Invention

Radio telephones or portable telephones, for example, analog cellular telephones in an E-TACS (Extended-Total Access Communication System), are allocated the following frequencies:

| | |
|---|---|
| Downlink channel frequency: | 917.0125–950.0125 MHz |
| Channel frequency: | 12.5 kHz |

Figure 1:
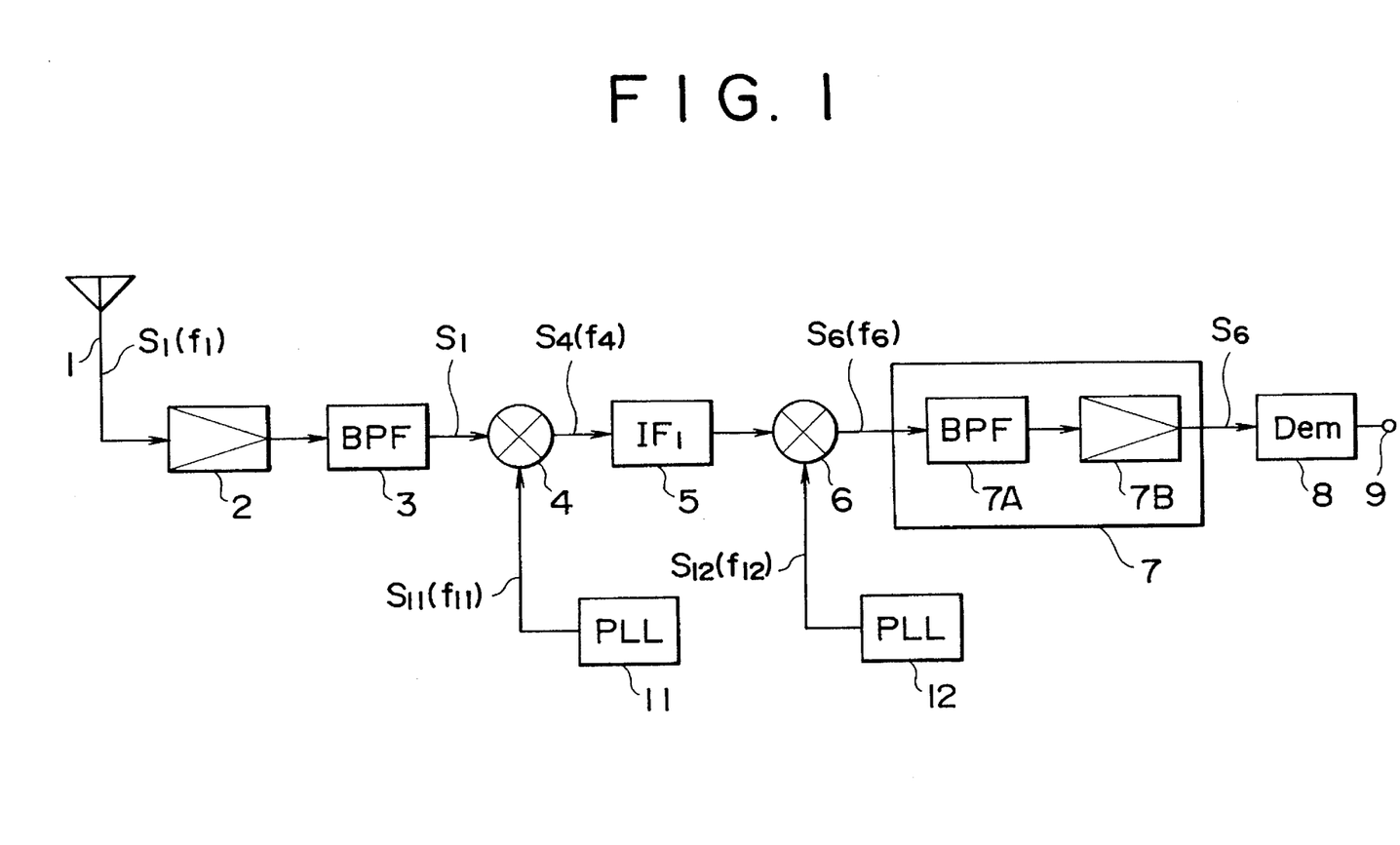
FIG. 1 is a block diagram showing an example of a receiving circuit.

For this reason, the signal receiving circuit used in E-TACS type cellular telephones may, for example, be a double super heterodyne circuit as shown in FIG. 1. In FIG. 1, a downlink channel FM signal S1 (frequency f1) from a base station is received by an antenna 1. The signal S1 received by the antenna 1 is supplied, through a radio frequency amplifier 2 and a band pass filter 3 which has a bandwidth passing through all the downlink channels, to a first mixer circuit 4. An oscillating signal S11 of a frequency f11 corresponding to a channel used for communication is output from a PLL (Phase Locked Loop) circuit 11. The oscillating signal S11 from the PLL circuit 11 as a first local oscillating signal is supplied to the first mixer circuit 4. In the first mixer circuit 4, the received signal S1 is converted into a first intermediate frequency signal S4 having a frequency f4 given by the following:

$$f4 = f11 - f1$$
$$= 55 \text{ MHz}$$

This first intermediate frequency signal S4 is supplied to a second mixer circuit 6 through a first intermediate frequency circuit 5, and an oscillating signal S12 having a frequency f12 given by the following:

$$f12 = 54.95 \text{ MHz}$$

is output from a PLL circuit 12. This oscillating signal S12 as a second local oscillating signal is supplied to the second mixer circuit 6.

In the second mixer circuit 6, the first intermediate frequency signal S4 is converted into a second intermediate frequency signal S6 having a frequency f6 given by the following:

$$f6 = f4 - f12$$
$$= 55 \text{ MHz} - 54.95 \text{ MHz}$$
$$= 50 \text{ kHz}$$

This second intermediate frequency signal S6 is supplied to an FM demodulating circuit 8 through a second intermediate frequency circuit 7, then an audio signal according to a voice of a user as a called party or a data signal from a base station, etc., are output from a terminal 9.

The above mentioned structures and operations of the receive circuit are general structures or operations in an analog cellular telephone.

However, as shown in FIG. 1, the second intermediate frequency circuit 7 has a band pass filter 7A that passes the second intermediate frequency signal S6 and an amplifier 7B that amplifies the second intermediate frequency signal S6. The first intermediate frequency circuit 5 has the same structure as the second intermediate frequency circuit 7. In general, the band pass filter 7A is composed of a ceramic filter device.

When the band pass filter 7A is composed of a ceramic filter device, the second intermediate frequency circuit 7, a former part of the circuit 7 and a later part of the circuit 7 cannot be integrated as an IC even if it is desired to do so. Consequently, when fabricating an IC circuit, the ceramic filter device must be mounted on a separate circuit board apart from the IC, and as a result, the advantage of the IC is less.

It has therefore been proposed to constitute the band pass filter 7A as an active filter so that it is possible to fabricate an IC.

However, in this case, as an analog cellular portable telephone is used in a narrow bandwidth FM system, the deviation of the center frequency of the band pass filter 7A is permitted only to be on the order of ±2 kHz. At this time, the second intermediate frequency f6 is 50 kHz. In other words, the deviation of the center frequency of the band pass filter 7A is therefore permitted only to be about ±4%.

However, if the active filter is composed of an IC, it is difficult to maintain the absolute values of resistances of resistors and electrostatic capacities of capacitors within a range of ±4% error values, and moreover, it is necessary to deal with variations in these values due to temperature characteristics. Hence, when the band pass filter 7A is integrated in an IC to use an active filter, it is necessary to be able to adjust or control the center frequency of the band pass filter 7A.

Figure 2:
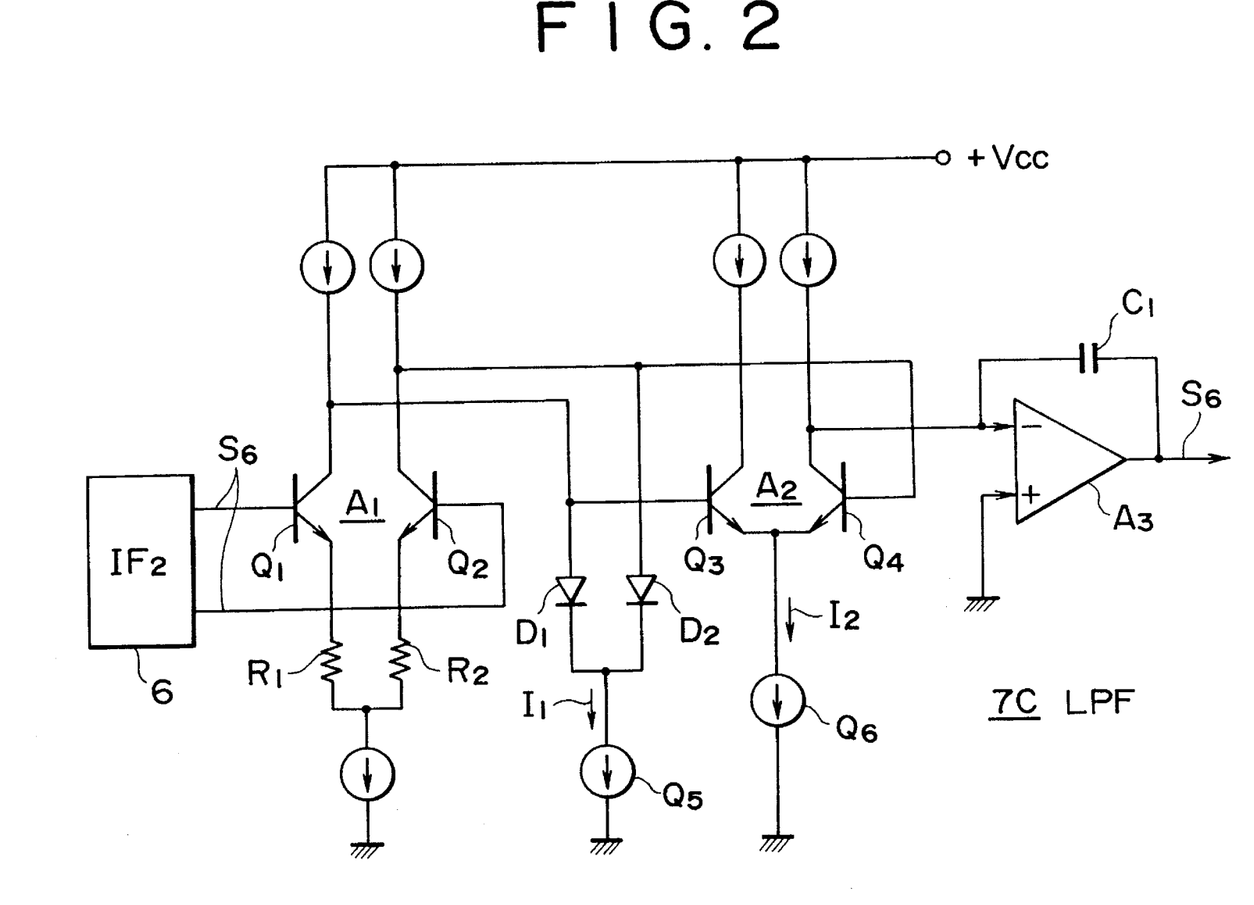
FIG. 2 is circuit diagram showing an example of a filter circuit.

For example, when constructing the band pass filter 7A using an active filter circuit, it may include the low pass filter part shown in FIG. 2.

According to this construction, the second intermediate frequency signal S6 from the second mixer circuit 6 is supplied to a differential amplifier A1 having transistors Q1, Q2 and emitter resistors R1, R2, and is voltage/current converted. The signal S6 thereby converted to a current is then supplied to a differential amplifier A2 having transistors Q3, Q4, diodes D1, D2 and a constant current source Q5 connected to the input portion of this differential amplifier A2. The output of the differential amplifier A2 is supplied to an operational amplifier A3. An integrating capacitor C1 is connected to the operational amplifier A3.

In the circuit shown in FIG. 2, a low pass filter 7C is composed of the output impedance of the amplifier A2 and the input capacitance of the operational amplifier A3. As a result, the operational amplifier A3 outputs the signal S6 in which the high frequency components thereof are eliminated. If a high pass filter is connected to the output portion of the operational amplifier A3, the band pass filter 7A is able to be constituted.

In other words:

$$fc = 1/(2\pi C1/gm)$$

wherein
  $gm$ = mutual conductance of amplifier A2, and
  $fc$ = cutoff frequency of low pass filter 7C.
In this case, $$gm = 1/(2R1) \times (I2/I1)$$

wherein

I1= constant current of constant current source Q5, and

I2= constant current of constant current source Q6 of amplifier A2.

The high frequency components of the signal input to the operational amplifier A3 are eliminated by the low pass filter 7C, and if the magnitude of I1 or I2 is controlled, the cutoff frequency fc of the low pass filter 7C may be adjusted or controlled.

However, in the low pass filter 7C shown in FIG. 2, the transistors Q1, Q2 and the transistors Q3, Q4, are arranged in a DC voltage cascade connection. The source voltage VCC of these transistors must be set high to obtain sufficient dynamic range.

The noise signals generated by the diodes D1, D2 and the base resistances of the transistors Q3, Q4 are amplified by the differential amplifier A2 and are mixed with the second intermediate frequency signal S6, so the noise level is at a high level. As a result, equivalent receiver sensitivity of the telephone decreases, hence this low pass filter 7C is not suitable as an intermediate frequency filter.

SUMMARY OF THE INVENTION

It is therefore an object of the present invention to provide an active filter which resolves the above-mentioned problem.

It is another object of the present invention to provide a portable telephone apparatus which resolves the above problem.

According to the present invention, there is provided an active filter including a voltage/current circuit, an integrating circuit and a current dividing circuit. The voltage/current conversion circuit converts an input signal voltage into a signal current. The signal current output by the voltage/current conversion circuit is divided between the integrating circuit and ground. The current dividing circuit extracts low frequency components of the input signal voltage from the integrating circuit, and adjusts the cutoff frequency with respect to the extracted low frequency components to change the dividing ratio of the signal current output from the conversion circuit between the integrating circuit and ground.

According to the present invention, there is provided a portable telephone apparatus including first and second intermediate frequency converters and an active filter circuit. The first intermediate frequency filter converts a received signal into a first intermediate frequency signal. The second intermediate frequency converter converts the first intermediate frequency signal output by the first intermediate frequency converter into a second intermediate frequency signal. The second intermediate frequency signal from the second intermediate frequency converter is supplied to the active filter. The active filter has a voltage/current circuit, an integrating circuit and a current dividing circuit. The voltage/current conversion circuit converts an input signal voltage into a signal current. The signal current output by the voltage/current conversion circuit is divided between the integrating circuit and ground. The current dividing circuit extracts low frequency components of the input signal voltage from the integrating circuit, and adjusts the cutoff frequency with respect to the extracted low frequency components to change the dividing ratio of the signal current output from the conversion circuit between the integrating circuit and ground.

According to the present invention, the cutoff frequency can be adjusted or controlled. Hence, when the circuit is integrated in an IC, compensation is possible even if errors of cutoff frequency occur due to scatter in the device or to temperature characteristics.

DESCRIPTION OF THE INVENTION

An active filter circuit according to the present invention will now be described in detail with reference to the drawings.

An active filter circuit according to the present invention described hereinafter will be described to apply a receiving circuit of a portable telephone apparatus as a cellular telephone.

Figure 3:
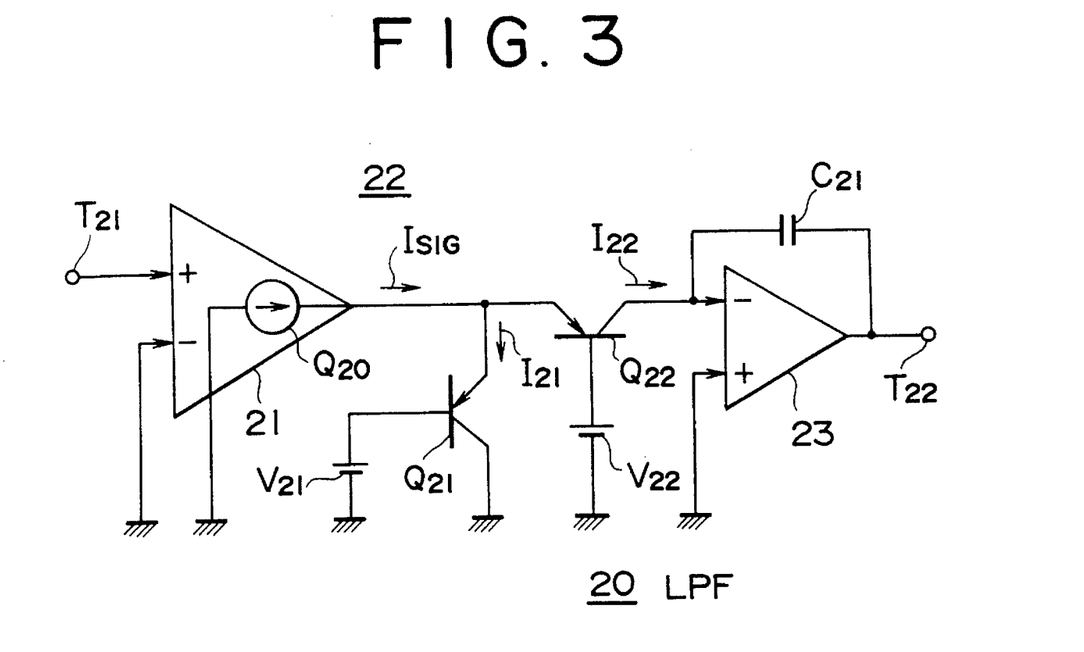
FIG. 3 is a circuit diagram showing the construction of an active filter according to a first embodiment of the present invention.

FIG. 3 shows a circuit diagram of an active filter circuit according to a first embodiment of the present invention.

In FIG. 3, T21 is an input terminal, and a reference numeral 21 denotes a voltage/current conversion circuit. For example, an output voltage of an output signal from the second mixer circuit 6 shown in FIG. 1 is supplied through the terminal T21 to the conversion circuit 21. According to this first embodiment, the conversion circuit 21 composed of an operational amplifier, and Q20 is an equivalent representation of the output part by a constant current source. The signal voltage supplied to the operational amplifier 21 is voltage/current converted into a constant signal current ISIG, and this signal current ISIG is output from the signal source Q20.

The output terminal of the operational amplifier 21 is connected to the emitters of transistors Q21, Q22 constituting a current dividing circuit 22, and control voltages V21, V22 are supplied to each of base of the transistor Q21, Q22.

The collector of the transistor Q21 is connected to the negative terminal of an operational amplifier 23, and the collector of the transistor Q22 is grounded. Also, an integrating capacitor C21 is connected between the negative terminal of the operational amplifier 23 and the output terminal of the operational amplifier 23, and the positive terminal of the operational amplifier 23 is grounded so as to constitute an integrating circuit. The output terminal of the operational amplifier 23 is connected to an output terminal T22.

The control voltages V21, V22 are varied together in mutually opposite directions, however, one voltage may be varied while the other is fixed.

According to the circuit shown in FIG. 3, after the signal voltage supplied to the input terminal T21 is converted into the signal current ISIG by the operational amplifier 21, it is supplied to the operational amplifier 23 through the transistor Q21. A low pass filter constitutes the impedance when the side of the transistor Q21 is viewed from the negative terminal of the operational amplifier 23, and the electrostatic capacitance when the output terminal T22 is viewed from the negative input terminal of the operational amplifier 23. As a result, low frequency components of the signal voltage input to the input terminal T21 is output from the output terminal T22. In other words, the circuit 20 shown in FIG. 3 functions as an active type low pass filter.

In this case, if I21 is the collector current of transistor Q21, and I22 is the collector current of transistor Q22, the signal current ISIG from the operational amplifier 21 is divided into the collector current I21 and the collector current I22.

If $\alpha$ is defined by the following equation:

$$\alpha = I21/(I21+I22) \quad (1)$$
$$= I21/ISIG$$

Consequently, the value $\alpha$ varies according to the voltage difference between the control voltage V21 and V22.

If gm is the mutual conductance of the operational amplifier 21, fc is the cutoff frequency of the low pass filter circuit 20, fc is defined by the following equation:

$$fc=1/(2\pi C21/(gm \cdot \alpha)) \quad (2)$$

Therefore, the circuit shown in FIG. 3 has a function as a low pass filter, and its cutoff frequency fc can be adjusted or controlled by the control voltages V21, V22.

As the circuit 20 shown in FIG. 3 functions as a low pass filter, the cutoff frequency fc can be controlled. When errors due to variations in the characteristics of devices or temperature characteristics arise from IC integration of the circuit 20, the circuit 20 can be compensated. Also, even if a resistor R21 has a temperature characteristic, it may be compensated by linking the control voltages V21, V22 to a voltage that detects temperature.

There is no need for the operational amplifiers 21, 23 to be of any special type operational amplifier. In addition, as there is no DC voltage cascade connection, a sufficient dynamic range can be obtained without increasing the source voltage, so, for example, a source voltage of 2 to 3 V may be used.

The signal voltage ISIG is merely divided by the transistors Q21, Q22, so noise can be reduced and the receiving sensitivity of the receiver can be increased when it is used for the intermediate frequency circuit of a receiver such as a portable telephone.

Next, an active filter circuit according to a second embodiment of the present invention will be described with reference to FIG. 4. Parts identical to those of FIG. 3 are given the same reference numerals and their detailed description is omitted.

Figure 4:
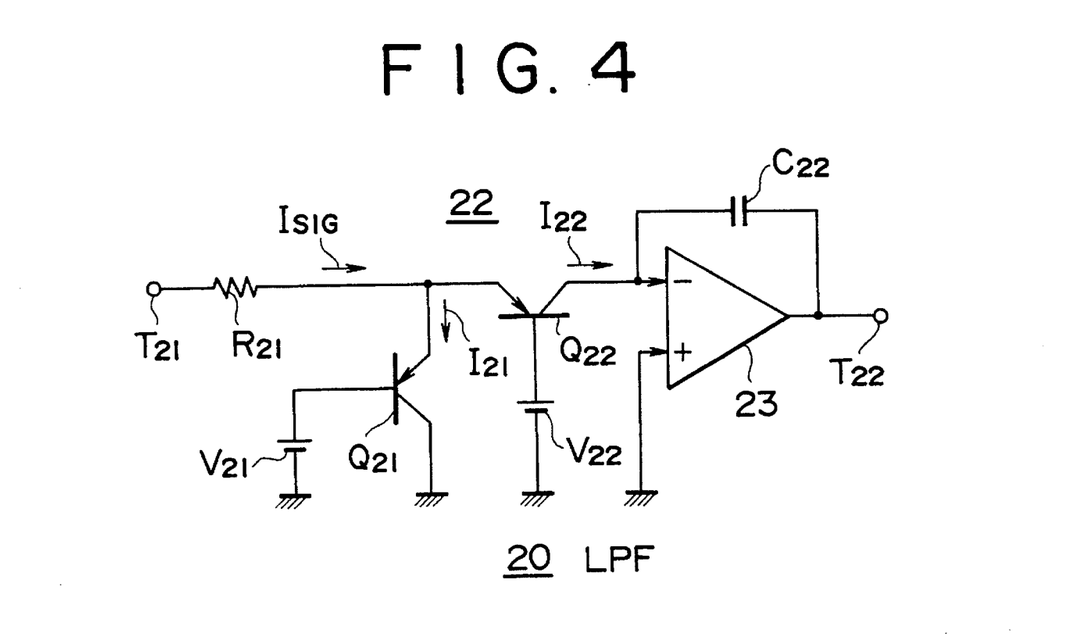
FIG. 4 is a circuit diagram showing the construction of an active filter according to a second embodiment of the present invention.

In the example shown in FIG. 4, voltage/current conversion of the input signal is performed by the resistor R21. In this case, fc and $\alpha$ are defined by following equations:

$$fc=1/(2\pi C21R21/\alpha) \quad (3)$$

$$\alpha= I21/(I21+I22) \quad (1)$$

Consequently, the cutoff frequency fc of the low pass filter is variable.

Next, an active filter circuit according to a third embodiment of the present invention will be described with reference to FIG. 5. Parts identical to those of FIG. 3 are given the same reference numerals and their detailed description is omitted.

Figure 5:
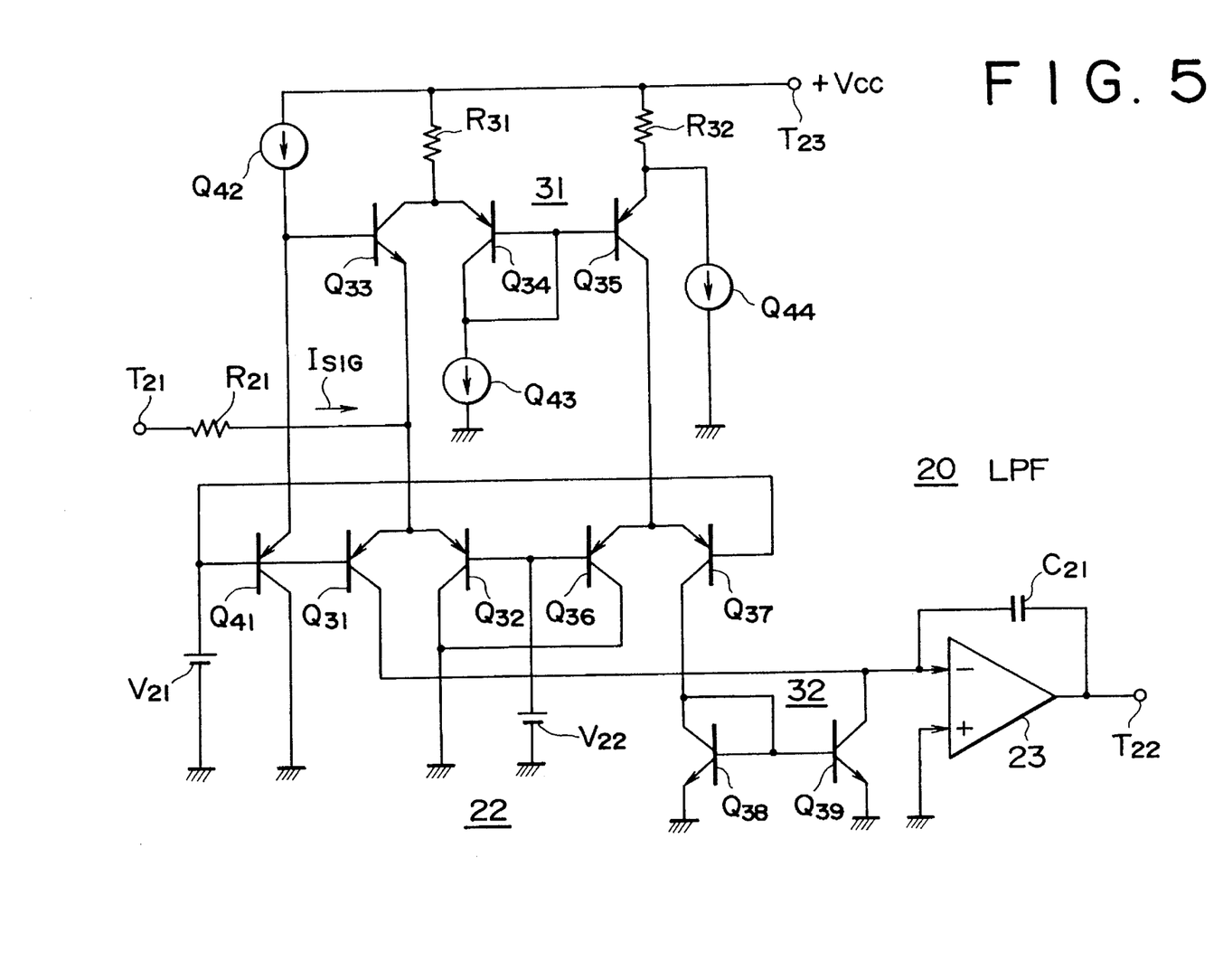
FIG. 5 is a circuit diagram showing the construction of an active filter according to a third embodiment of the present invention.

In the third embodiment shown in FIG. 5, a current dividing circuit 22 constitutes a push-pull circuit. The input terminal T21 is connected to the emitters of transistors Q31, Q32 through the resistor R21, the collector of the transistor Q31 is connected to the negative terminal of the operational amplifier 23, and the collector of the transistor Q32 is grounded. The control voltage V21 is supplied to the base of the transistor Q31, and the control voltage V22 is supplied to the base of the transistor Q32.

Each emitter of the transistors Q31, Q32 is connected to the emitter of a transistor Q33; the collector of the transistor Q33 is connected to the power supply terminal T23 through a resistor R31. There is provided a transistor Q41 and the control voltage V21 is supplied to the base of the transistor Q41; the collector of the transistor Q41 is grounded. A constant current source Q42 is connected between the emitter of the transistor Q41 and the terminal T23. The emitter of the transistor Q41 is connected to the base of the transistor Q33.

There are provided transistors Q34, Q35; the emitter of the transistor Q34 is connected to the emitter of the transistor Q33. The bases of the transistors Q34, Q35 are connected together, and to the collector of the transistor Q34. A constant current source Q43 is connected between the collector of the transistor Q34 and ground. The emitter of the transistor Q35 is connected to the power supply terminal T23 through a resistor R32, and a constant current source Q44 is connected between the collector of the transistor Q35 and ground. The transistors Q34, Q35 therefore constitute a current mirror circuit 31 with the power supply terminal T23 as a reference potential point.

There are provided transistors Q36, Q37. The emitters of the transistors Q36, Q37 are each connected to the collector of the transistor Q35. The control voltage V22 is supplied to the base of the transistor Q36, and the control voltage V21 is supplied to the base of the transistor Q37.

There are further provided transistors Q38, Q39. The bases of the transistors Q38, Q39 are connected together and to the collector of the transistor Q38; the emitters of the transistors Q38, Q39 are grounded. The collector of the transistor Q38 is connected to the collector of the transistor Q37, and the collector of the transistor Q39 is connected to the negative terminal of the operational amplifier 23. The transistors Q38, Q39 therefore constitute a current mirror circuit with ground as a reference potential point.

A capacitor C21 is connected to the operational amplifier 23 so as to constitute an integrating circuit, and the output terminal T22 is also connected to the operational amplifier 23.

According to the circuit shown in FIG. 5, the transistor Q41 functions as an emitter follower, so the bases of the transistors Q31, Q33 are alternately grounded and the transistors Q31, Q33 operate as base grounds. At this time, the operation of the transistors Q31, Q33 are class AB operation.

The positive half cycle of the signal current ISIG from the resistor R21 is supplied to the negative terminal of the operational amplifier 23 through the signal line such as the resistor R21→the transistor Q31. Further, the negative half cycle of the signal current ISIG from the resistor R21 is supplied to the negative terminal of the operational amplifier 23 via the signal line such as the resistor 21→the transistor Q33→the transistor Q34→the transistor Q35→the transistor Q37→the transistor Q38→the transistor Q39.

The signal current ISIG is therefore supplied to the operational amplifier 23, and the circuit shown in FIG. 5 functions as a low pass filter.

In this case, part of the signal current ISIG supplied to the transistor Q32 from the resistor R21 is shunted to ground through the transistor Q32. Also, part of the signal current ISIG supplied to the transistor Q37 from the transistor Q35 is shunted to ground through the transistor Q36. When the signal current ISIG is supplied to the operational amplifier 23 from the resistor R21, therefore, part of it is divided.

If the level of the control voltage V21 is a higher level or the level of the control voltage V22 is a lower level, the level of the signal current ISIG supplied to the operational amplifier 23 is changed to a higher level, and the level of the current shunted to ground is a lower level. On the other hand, if the level of the control voltage V21 is a lower level or the level of the control voltage V22 is a higher level, the level of the signal current ISIG supplied to the operational amplifier 23 is a lower level, and the level of the current shunted to ground is changed to a higher level.

The ratio of the signal current ISIG supplied to the operational amplifier 23 and the shunted signal current ISIG therefore is varied according to the control voltage V21 or V22, so the cutoff frequency fc can be adjusted or controlled.

This low pass filter circuit 20 in FIG. 5 operates in class AB operation, so noise level can be decreased and power consumption reduced.

Next, an active filter circuit according to a fourth embodiment of the present invention will be described with reference to FIG. 6. Parts identical to those of FIG. 3 are given the same reference numerals, and their detailed description is omitted.

Figure 6:
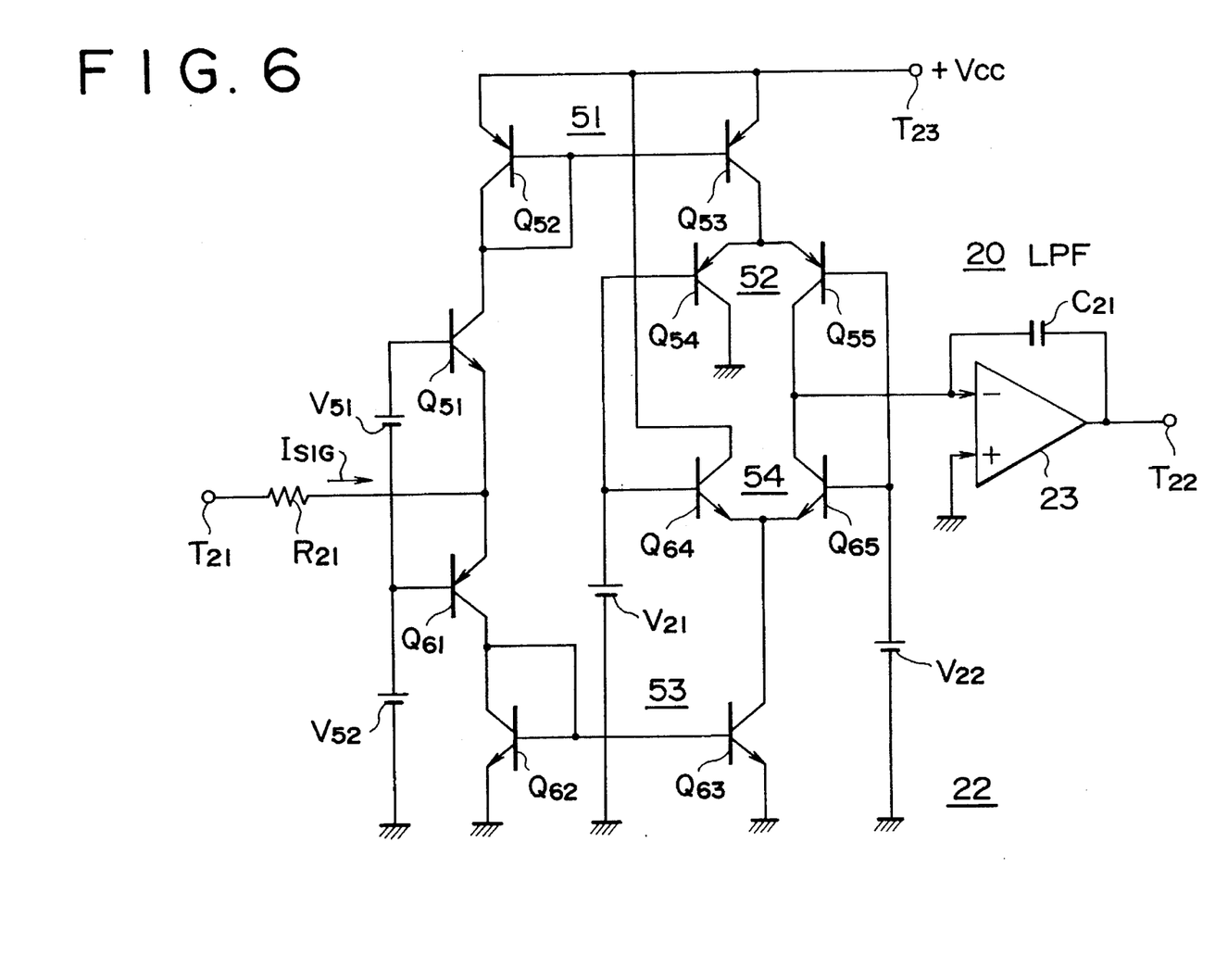
FIG. 6 is a circuit diagram showing the construction of an active filter according to a fourth embodiment of the present invention.

In the fourth embodiment shown in FIG. 6, the current dividing circuit 22 constitutes a complementary circuit. The input terminal T21 is connected to the emitters of transistors Q51, Q61 through the resistor R21, and predetermined bias voltages V51, V61 are supplied to each base of the transistors Q51, Q61, respectively, so that the transistors Q51, Q61 operate in class AB operation.

The collector of the transistor Q51 is connected to the collector of the transistor Q52. This transistor Q52 and the transistor Q53 constitute a current mirror circuit 51 with the power supply terminal T23 as a reference potential point. Each base of the transistors Q52, Q53 are connected together and to the collector of the transistor Q52, and their emitters are connected to the power supply terminal T23.

The collector of the transistor Q53 is connected to the emitters of the transistors Q54, Q55 which constitute a differential amplifier 52; the control voltage V21 is supplied to the base of the transistor Q54, and the control voltage V22 is supplied to the base of the transistor Q55. The collector of the transistor Q54 is grounded, and the collector of the transistor Q55 is connected to the negative terminal of the operational amplifier 23.

Further, the collector of the transistor Q61 is connected to the collector of the transistor Q62. This transistor Q62 and a transistor Q63 constitute a current mirror circuit 53 with ground as a reference potential point. Each base of the transistors Q62, Q63 are connected together and to the collector of the transistor Q62; and the emitters of the transistors Q62, Q63 are connected to ground.

The collector of the transistor Q63 is connected to the emitters of transistors Q64, Q65 which constitute a differential amplifier 54; the control voltage V21 is supplied to the base of the transistor Q64, and the control voltage V22 is supplied to the base of the transistor Q65. The collector of the transistor Q64 is grounded, and the collector of the transistor Q65 is connected to the negative terminal of the operational amplifier 23.

The capacitor C21 is connected to the operational amplifier 23, and the capacitor C21 and the operational amplifier 23 constitute an integrating circuit. The output terminal T22 is also connected to the operational amplifier 23.

According to the circuit shown in FIG. 6, the bases of the transistors Q51, Q61 are alternately grounded and the transistors Q51, Q61 operate as base grounds.

The positive half cycle of the signal current ISIG from the resistor R21 is therefore supplied to the negative terminal of the operational amplifier 23 through the signal line such as the resistor R21→the transistor Q61→the transistor 62→the transistor 63→the transistor Q65. Further, the negative half cycle of the signal current ISIG from the resistor R21 is supplied to the negative terminal of the operational amplifier 23 through the signal line such as the resistor 21→the transistor Q51→the transistor Q52→the transistor Q53→the transistor Q55.

The signal current ISIG is supplied to the operational amplifier 23, and the circuit shown in FIG. 6 functions as a low pass filter.

In this case, part of the signal current ISIG supplied to the transistor Q65 from the transistor Q63 is shunted to the terminal T23 through the transistor Q64. Also, part of the signal current ISIG supplied to the transistor Q55 from the transistor Q53 is shunted to ground through the transistor Q54. When the signal current ISIG is supplied to the operational amplifier 23 from the resistor R21, therefore, part of it is shunted.

If the level of the control voltage V21 is a higher level or the level of the control voltage V22 is a lower level, the level of the signal current ISIG supplied to the operational amplifier 23 increases, and the level of the current shunted to ground and the power supply terminal T23 decreases. On the other hand, if the level of the control voltage V21 is a lower level or the level of the control voltage V22 is a higher level, the level of the signal current ISIG supplied to the operational amplifier 23 decreases, and the amount of the current shunted to ground and the divided current of the power supply terminal T23 increase.

The ratio of the signal current ISIG supplied to the operational amplifier 23 and the shunted signal current ISIG therefore is varied according to the control voltage V21 or V22, so the cutoff frequency fc can be adjusted or controlled.

This low pass filter circuit 20 shown in FIG. 6 has a complementary connection, so there is not much secondary distortion created.

An active filter circuit according to a fifth embodiment of this invention will now be described with reference to FIG. 7. Parts identical to those of FIG. 3 are given the same reference numerals, and their detailed description is omitted.

Figure 7:
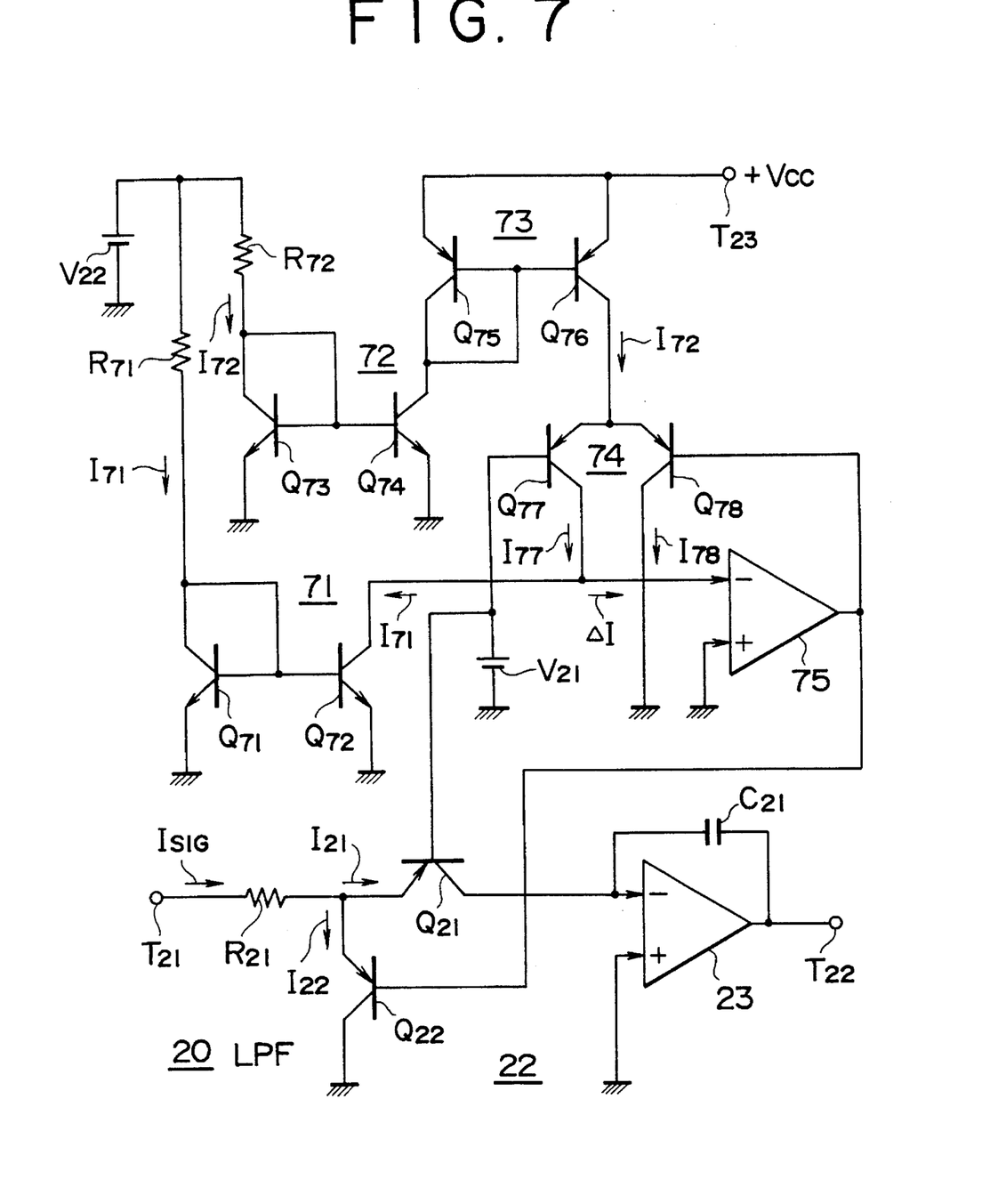
FIG. 7 is a circuit diagram showing the construction of an active filter according to a fifth embodiment of the present invention.

According to the fifth embodiment shown in FIG. 7, even when the resistor used for voltage/current conversion has a temperature characteristic, the circuit is such that the cutoff frequency does not have a temperature characteristic. In this embodiment, the input terminal T21 is connected to the negative terminal of the operational amplifier 23 through the resistor R21 and across the emitter and the collector of the transistor Q21, while the emitter and the collector of the transistor Q22 are connected between the emitter of the transistor Q21 and ground. The control voltage V21 is supplied to the base of the transistor Q21, and the integrating capacitor C21 is connected to the operational amplifier 23 so as to constitute an integrating circuit.

The control voltage V22 is converted into a current I71 by a resistor R71, and this current I71 is supplied to the base of a transistor Q71. This transistor Q71 and a transistor Q72 constitute a current mirror circuit 71 with ground as a reference potential point. In other words, the bases of the transistors Q71, Q72 are connected together and to the collector of the transistor Q71; each of the emitters of the transistors Q71, Q72 are grounded.

The collector of the transistor Q72 is connected to the negative terminal of an operational amplifier 75; the positive terminal of the operational amplifier 75 is grounded. The output terminal of the operational amplifier 75 is connected to the base of the transistor Q22.

The control voltage V22 is also converted into a current I72 by a resistor R72, and this current I72 is supplied to the base of a transistor Q73. This transistor Q73 and a transistor Q74 constitute a current mirror circuit 72 with ground as a reference potential point. In other words, the bases of the transistors Q73, Q74 are connected together and to the collector of the transistor Q73. Each emitter of the transistors Q73, Q74 is grounded. The collector of the transistor Q74 is connected to the base of a transistor Q75.

This transistor Q75 and a transistor Q76 constitute a current mirror circuit 73 with the power supply terminal T23 as a reference potential point. Each base of the transistors Q75, Q76 is connected together and to the collector of the transistor Q75. Each emitter of the transistors Q75, Q76 is connected to the terminal T23; and the collector of the transistor Q76 is connected to the emitters of transistors Q77, Q78.

In this case, the transistors Q77, Q78 constitute a differential amplifier 74 using the transistor Q76 as a constant current source. The control voltage V21 is supplied to the base of the transistor Q77, and the collector of the transistor Q77 is connected to the collector of the transistor Q72. The base of the transistor Q78 is connected to the output terminal of the operational amplifier 75, and the collector of the transistor Q78 is grounded.

The resistor R71 has a sufficiently small temperature characteristic, and when the circuit shown in FIG. 7 is integrated in an IC, the resistor R71 is removed from the IC and mounted on a circuit board together with the IC part of the circuit. The resistors R21, R72 may, for example, be formed adjacent to each other within the IC, and given an identical temperature characteristic. In addition, when the control voltages V21, V22 both vary, they are made to vary in the same direction.

According to this embodiment, as in the case of the circuit shown in FIG. 4, the signal voltage supplied to the terminal T21 is converted into a signal current ISIG by the resistor R21. This signal current ISIG is divided by the transistors Q21, Q22 and supplied to the operational amplifier 23. The circuit shown in FIG. 7 therefore also functions as a low pass filter, and its cutoff frequency fc is expressed by the above-mentioned equations (1) and (3).

In this case, the transistors Q73, Q74 constitute the current mirror circuit 72, and the transistors Q75, Q76 constitute the current mirror circuit 73. When the current I72 flows through the resistor R72, therefore, the current I72 also flows to the collector of the transistor Q76.

This current I72 is a constant current of the differential amplifier 74; if I77 is the collector current of the transistor Q77 and I78 is the collector current of the transistor Q78, the current I72 is defined by the following equation:

$$I72 = I77 + I78 \quad (4)$$

Further, the transistors Q71, Q72 constitute the current mirror circuit 71. When the current I71 flows through the resistor R71, therefore, the current I71 also flows to the collector of the transistor Q72.

Consequently, if ΔI is the current flowing through the negative terminal of the operational amplifier 75, ΔI is defined by the following equation:

$$\Delta I = I71 - I77 \quad (5)$$

However, the output of the operational amplifier 75 is then fed back to the base of the transistor Q78, so in the steady state:

$$\Delta I = 0$$

Equation (5) therefore becomes:

$$I77 = I71$$

and equation (4) becomes:

$$\begin{aligned} I72 &= I77 + I78 \quad (6) \\ &= I71 + I78 \\ \therefore I78 &= I72 - I71 \end{aligned}$$

The voltage supplied to the base of the transistor Q78 is then supplied to the base of the transistor Q22, so the collector current I22 of the transistor Q22 varies in the same direction as the collector current I78 of the transistor Q78. The collector current I22 is defined by the following equation:

$$I22 = k \cdot I78 \quad (7)$$

wherein k is a constant.

Further, in the low pass filter circuit 20 shown in FIG. 7, equations (1) and (3) are true, therefore:

$$fc = 1/(2\pi C21 R21/\alpha) \quad (3)$$

$$\alpha = I21/(I21 + I22) \quad (1)$$

And fc rewritten according to the above equations (1) and (3):

$$\begin{aligned} fc &= 1/(2\pi C21 R21/\alpha) \\ &= I21/(2\pi C21 R21/(I21 + I22)) \end{aligned}$$

Substituting equation (7) for the above equation, fc is defined by the following equation:

$$fc = 1/(2\pi C21 R21/(I21 + k \cdot I78)) \quad (8)$$

When the temperature varies, the resistance of the resistor R21 varies, but the resistance of the resistor R72 also varies in the same direction. Therefore, when the resistance of the resistor R21 increases, the resistance of the resistor R72 also increases, the current I72 decreases and the current I78 decreases. When the resistance of the resistor R21 decreases, the resistance of the resistor R72 also decreases, the current I72 increases and the current I78 increases.

As mentioned above, even when the temperature varies, in equation (8), the value of the resistor R21 and the current I78 vary in opposite directions, so the cutoff frequency fc is maintained effectively constant. In other words, even if there is a temperature change in the resistance of the resistor R21, the cutoff frequency fc is maintained effectively constant to be temperature-compensated.

If the control voltage V22 is varied, the magnitude of the current I72 varies, and the cutoff frequency fc varies. Alternatively, if the control voltage V21 is varied, the current I21 varies so that the cutoff frequency fc varies.

If the above-mentioned low pass filter is provided in the negative feedback line of another operational amplifier, it can constitute a high pass filter overall.

In the above-mentioned embodiments, the filter circuit has been described when applied to the receiver circuit of a portable telephone as a cellular telephone, however, it is understood that it may also be applied to an FM receiver.

What is claimed is:

1. An active filter circuit comprising:

a voltage/current conversion circuit converting an input signal voltage into a signal current;

an integrating circuit; and a current dividing circuit dividing the signal current output by said voltage/current conversion circuit between an input of said integrating circuit and ground, said current dividing circuit passing low frequency components of the input signal voltage from said integrating circuit, and adjusting a cutoff frequency with respect to passed low frequency components to change a dividing ratio of the signal current from said voltage/current conversion circuit between the input of said integrating circuit and ground.

2. The active filter circuit according to claim 1, wherein said current dividing circuit comprises a base-grounded first transistor connected in series in a signal line carrying said signal current, and a second transistor having an emitter and collector connected in parallel with said signal line, whereby said cutoff frequency is varied by varying the collector currents of said first and second transistors in mutually opposite directions.

3. The active filter circuit according to claim 2, wherein said voltage/current conversion circuit comprises a resistor.

4. The active filter circuit according to claim 3, wherein said voltage/current conversion circuit further comprises a second resistor having a same temperature characteristic as said resistor, and in response to a current flowing through said second resistor, the dividing ratio in said current dividing circuit is varied in a direction to compensate a temperature variation of said cutoff frequency by means of said resistor.

5. The active filter circuit according to claim 2, wherein said current dividing circuit comprises a push-pull circuit.

6. The active filter circuit according to claim 2, wherein said current dividing circuit comprises a complementary circuit.

7. A portable telephone apparatus comprising:

first intermediate frequency conversion means for converting a received signal into a first intermediate frequency signal;

second intermediate frequency conversion means for converting the first intermediate frequency signal output from said first intermediate frequency conversion means into a second intermediate frequency conversion signal; and an active filter circuit receiving the second intermediate frequency signal from said second intermediate frequency conversion means, said active filter having a voltage/current conversion circuit for converting the signal voltage of the second intermediate frequency signal from said second intermediate frequency conversion means to a signal current, an integrating circuit, and a current dividing circuit dividing the signal current output by said voltage/current conversion circuit between an input of said integrating circuit and ground, said current dividing circuit extracting low frequency components of the input to said integrating circuit, and adjusting an extracted cutoff frequency with respect to said low frequency components to change a dividing ratio of the signal current output from said voltage/current conversion circuit between the input of said integrating circuit and ground.

8. The portable telephone apparatus according to claim 7, wherein said current dividing circuit comprises a base-grounded first transistor connected in series in a signal line carrying the signal current, and a second transistor having an emitter and collector connected in parallel with said signal line, whereby said cutoff frequency is varied by varying the collector currents of said first and second transistors in mutually opposite directions.

9. The portable telephone apparatus according to claim 8, wherein said voltage/current conversion circuit comprises a resistor.

10. The portable telephone apparatus according to claim 9, wherein said voltage/current conversion circuit further comprises a second resistor having a same temperature characteristic as said resistor, and in response to a current flowing through said second resistor, the dividing ratio of said current dividing circuit is varied in a direction to compensate a temperature variation of said cutoff frequency by means of said resistor.

11. The portable telephone apparatus according to claim 8, wherein said current dividing circuit comprises a push-pull circuit.

12. The portable telephone apparatus according to claim 8, wherein said current dividing circuit comprises a complementary circuit.

* * * * *